United States Patent [19]

Sakai

[11] 4,394,625
[45] Jul. 19, 1983

[54] SEMICONDUCTOR INTEGRATED CIRCUIT DEVICE

[75] Inventor: Koichi Sakai, Tokyo, Japan

[73] Assignee: Toko, Inc., Tokyo, Japan

[21] Appl. No.: 332,854

[22] Filed: Dec. 21, 1981

Related U.S. Application Data

[63] Continuation of Ser. No. 96,429, Nov. 21, 1979.

[30] Foreign Application Priority Data

Dec. 6, 1978 [JP] Japan ................................. 53/151231
Mar. 28, 1979 [JP] Japan ................................. 54/40157

[51] Int. Cl.³ ............................................. H03F 3/30
[52] U.S. Cl. .................................... 330/267; 330/307
[58] Field of Search ............... 330/263, 267, 268, 288, 330/307; 357/44

[56] References Cited

U.S. PATENT DOCUMENTS

| | | | |
|---|---|---|---|
| 3,629,691 | 12/1971 | Wheatley | 307/297 X |
| 3,883,813 | 5/1975 | Sekiya | 330/268 |
| 4,038,680 | 7/1977 | Yagi et al. | 357/44 |

Primary Examiner—James B. Mullins
Attorney, Agent, or Firm—Gerald J. Ferguson, Jr.; Joseph J. Baker

[57] ABSTRACT

A semiconductor integrated circuit device including a power amplifier circuit which includes a first PNP transistor, first NPN transistor, second PNP transistor and second NPN transistor which are formed in a common semiconductor substrate. The first PNP transistor is formed as a vertical type one which constitutes, together with the second NPN transistor, a first inverted Darlington circuit. The first NPN transistor, together with the second PNP transistor, constitutes a second inverted Darlington circuit. A d.c. power source is supplied to the emitter of the vertical type PNP transistor, with the emitter of the first NPN transistor being grounded.

16 Claims, 8 Drawing Figures

SEMICONDUCTOR INTEGRATED CIRCUIT DEVICE

This is a continuation of application Ser. No. 96,429, filed Nov. 21, 1979.

This invention relates to a semiconductor integrated circuit device suitable for a low frequency amplifier circuit capable of being driven with a lower voltage power source.

It is an object of the present invention to provide a low frequency power amplifier circuit using a vertical type PNP transistor with a high current amplification factor $h_{FE}$.

A further object of this invention is to provide a low frequency power amplifier circuit which is integrated in a common semiconductor substrate and which is capable of operating with a low voltage, thus, resulting in an enhanced voltage utilization efficiency of the power source voltage.

A still further object of this invention is to eliminate distortion which tends to occur in the signal output of a low frequency power amplifier, in the case where a complementary symmetrical circuit using vertical type PNP and NPN transistor provided at the output stage of the amplifier is formed in a common semiconductor substrate, due to the fact that these transistors differ from each other in terms of current amplification factor $h_{FE}$.

Other objects, features and advantages of the present invention will become apparent from the ensuing description taken in conjunction with the accompanying drawings.

In order to give a better understanding of the present invention, description will first be made of the prior-art low frequency amplifier circuit arrangements which have conventionally been employed in audio amplifiers, with reference to FIGS. 1 and 2.

Figure 1:
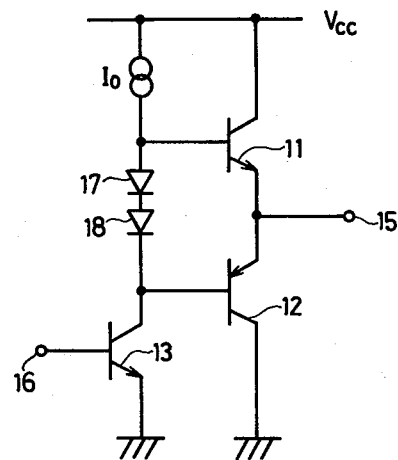
FIG. 1 is a circuit diagram showing an example of prior-art low frequency amplifier circuit.

In the low frequency amplifier circuit shown in FIG. 1, an NPN transistor 11 has its collector connected with a power source Vcc, the emitter of the NPN transistor 11 being connected with the emitter of a PNP transistor 12 the collector of which is grounded. Thus, the series connection of the NPN transistor 11 and PNP transistor 12 is connected between the power source Vcc and ground. Two diodes 17 and 18 are provided, the cathode of the diode 17 being connected with the anode of the diode 18. The anode of the diode 17 is tied to the base of the NPN transistor 11, and the cathode of the diode 18 is coupled to the base of the PNP transistor 12. Another NPN transistor 13 is provided which has its emitter grounded and its collector connected with the cathode of the diode 18. Furthermore, a constant current Io is provided which is connected between the power source Vcc and the anode of the diode 17, whereby the NPN transistor 13 and PNP transistor 12 are biased through the diodes 17 and 18. An input terminal 16 is led out of the base of the NPN transistor 13, and an output terminal 15 is led out of the connection point between the NPN transistor 11 and the PNP transistor 12.

With such a circuit arrangement as mentioned just above, however, difficulty has been encountered in an attempt to achieve an enhanced voltage utilization efficiency due to the fact that there is caused a remarkable power loss, in the case where the power source voltage in use is as low as about 3 V.

Explaining more specifically about the low frequency amplifier circuit exemplified in FIG. 1, the NPN transistor 11 and PNP transistor 12 are employed at the output stage of the low-frequency amplifier circuit shown in FIG. 1, and thus, a d.c. voltage (referred to as $V_{BE}$ hereinafter) occurs between the base and the emitter of each of these transistors, so that the voltage utilization efficiency is thereby lowered. This adverse effect becomes remarkable especially for the case where the power source voltage is as low as about 3 V.

More specifically, the $V_{BE}$ of a transistor which is formed in a silicon substrate is generally about 0.7–0.8 V; thus, when the power source voltage Vcc for the low frequency amplifier circuit is relatively high, the power loss due to $V_{BE}$ is negligible, whereas when the power source voltage is as low as about 3 V, such power loss cannot be neglected since the sum of the $V_{BE}$ voltages of these two transistors provided at the output stage reaches about 1.5 V so that the maximum amplitude (peak-to-peak value) of an audio signal is limited to about 1.5 V, as a result of which the efficiency of the power amplifier circuit is greatly reduced. Moreover, under a low voltage condition, there is the tendency that the audio output is subject to distortion so that the low frequency amplifier circuit fails to operate satisfactorily.

In view of what has been mentioned just above, by employing germanium transistors whose $V_{BE}$ is lower at the output stage of a low frequency circuit, it may be possible to reduce the power loss and thus achieve an enhanced efficiency.

Practically, however, it is impossible to integrate low frequency amplifier circuit comprising elements consisting of such different types of semiconductor material in the same semiconductor substrate. If it were attempted to obtain such an amplifier circuit in the form of a hybrid integrated circuit, an increased number of components as well as an increased number of manufacturing steps would be required.

Furthermore, various limitations are laid on the steps of fabricating a semiconductor device including integrated transistors, which are opposite in polarity to each other, in a common semiconductor substrate. Especially, when a complementary type circuit comprising a PNP transistor and an NPN transistor is formed at the output stage of a low frequency amplifier circuit, it is preferred that these transistors have an equal current amplification factor $h_{FE}$. As well known in the art, a PNP transistor taking a monolithic form is commonly formed as a lateral type transistor, and the current amplification factor $h_{FE}$ thereof is lower than that of an NPN transistor; thus, in order to achieve a desired current amplification factor, such a PNP transistor should be combined with an NPN transistor to constitute a Darlington circuit.

Figure 2:
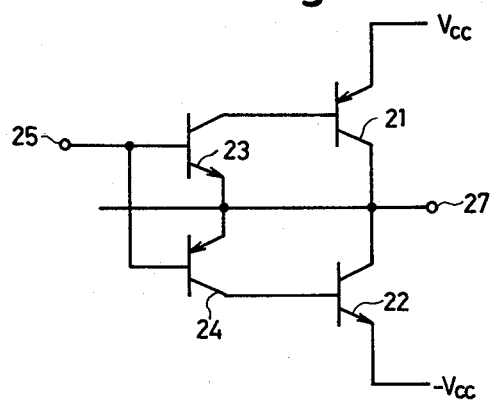
FIG. 2 is a circuit diagram showing an example of conventional inverted Darlington circuit arrangement.

Referring now to FIG. 2, there is shown a low frequency amplifier circuit using a Darlington circuit arrangement.

An inverted Darlington circuit such as shown in FIG. 2 has conventionally been employed at the output stage of a low frequency power amplifier. In FIG. 2, a PNP transistor 21 and an NPN transistor 22 are connected in series between a voltage source Vcc and another voltage source-Vcc; the base of the PNP transistor 21 is connected with the collector of an NPN transistor 23 to constitute a first Darlington circuit; and the base of the NPN transistor 22 is connected with the collector of a PNP transistor 24 to constitute a second Darlington circuit. The NPN transistor 23 and PNP transistor 24 have their emitters connected with each other. An input terminal 25 is led out of the interconnected bases of the transistors 23 and 24, and an output terminal 27 is led out of the interconnected collectors of the transistors 21 and 22.

A desired current amplification factor can be achieved with the Darlington circuit formed as mentioned just above. However, with the circuit arrangement of FIG. 2, too, for a power source voltage as low as about 3 V, power loss due to the $V_{BE}$ of the input NPN transistor 23 cannot be neglected, so that the voltage utilization efficiency becomes lower, as was the case with the prior art circuit arrangement shown in FIG. 1. Moreover, the circuit arrangement shown in FIG. 2, like the low frequency amplifier circuit shown in FIG. 1, is not necessarily suitable to be fabricated in the form of an integrated circuit device.

In the case where a complementary symmetrical circuit using PNP and NPN transistors is formed in a common semiconductor substrate as mentioned above, there is the tendency that the signal output is liable to be subject to distortion due to the fact that the individual transistors differ from ach other in terms of current amplification factor $h_{FE}$.

The present invention is intended to overcome the aforementioned drawbacks of the prior-art techniques.

The present invention will now be described in greater detail with reference to FIGS. 3 and 8.

Figure 3:
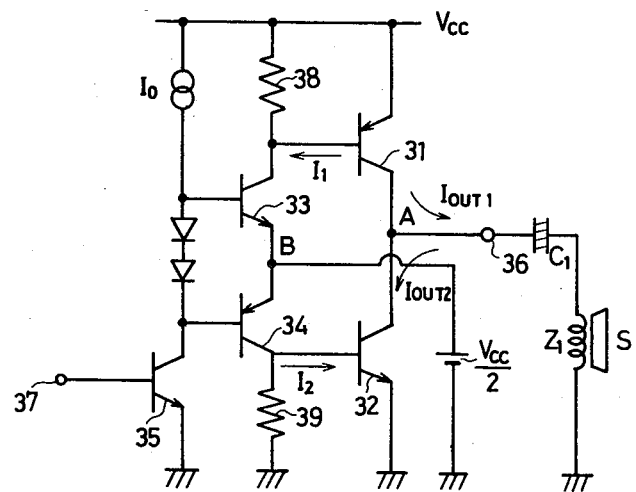
FIG. 3 is a circuit diagram showing the low frequency amplifier circuit according to an embodiment of the present invention.

Referring to FIG. 3, there is shown the low frequency amplifier circuit according to an embodiment of the present invention, wherein a PNP transistor 31 and an NPN transistor 32 are connected in series between a power source Vcc and ground; and a resistor 38, an NPN transistor 33, a PNP transistor 34 and a resistor 39 are also connected in series between the power source Vcc and ground. The PNP transistor 31 has its base coupled to the connection point between the resistor 38 and the collector of the NPN transistor 33, and the NPN transistor 32 has its base tied to the connection point between the collector of the PNP transistor 34 and the resistor 39. Two diodes are connected between the bases of the transistors 33 and 34 and grounded via a transistor 35. There is provided a constant current source $I_0$ which feeds to these two diodes so that the transistors 33 and 34 are biased thereby. An input terminal 37 is led out of the base of the NPN transistor 35, and an output terminal 36 is led out of the connection point A between the PNP transistor 31 and the NPN transistor 32. A d.c. voltage of Vcc/2 is imparted to the connection point B between the NPN transistor 33 and the PNP transistor 34. A loudspeaker S representing a load impedance $Z_l$ is connected at one end with the output terminal 36 through a coupling capacitor $C_1$ and grounded at the other end.

Figure 7:
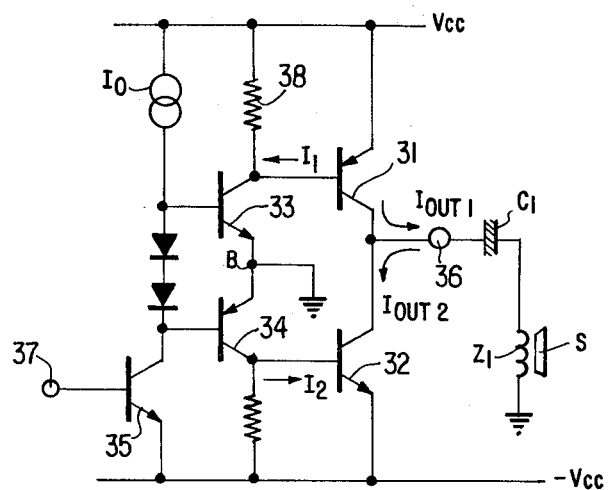
FIG. 7 is a circuit diagram showing the low frequency amplifier circuit according to still another embodiment of the present invention.

In a double power source system, that is, in the case where the transistors 31 and 32 are connected in series between the power source Vcc and a negative power source—Vcc, the connection point B between the emitters of the transistors 33 and 34 is grounded, as shown in FIG. 7.

Figure 4:
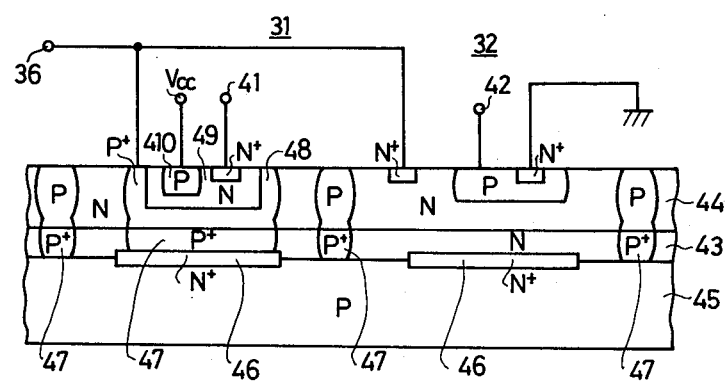
FIG. 4 is a schematic cross-sectional view showing a semiconductor integrated circuit device including a vertical type PNP transistor and an NPN transistor in accordance with the present invention.

Referring to FIG. 4, there is shown, in a schematic cross-sectional view, a semiconductor integrated-circuit device constituting the low frequency amplifier circuit according to one embodiment of the present invention, illustrating the region in which the PNP transistor 31 and NPN transistor 32 of the low frequency amplifier circuit are formed in a common semiconductor substrate.

To fabricate the semiconductor integrated circuit device according to the present invention, two, first and second, N type epitaxial layers 43 and 44 are first formed in superimposed relationship with each other on a P type semiconductor substrate 45; then a first P+ layer 47 is formed in the first epitaxial layer 43; and a second P+ type layer 48 is formed in the second epitaxial layer 44 in such a manner as to extend as far as the aforementioned first P+ type layer 47 so that a collector region is thereby defined. In that portion of an N type epitaxial layer 49 which is surrounded by the second P+ type layer 48 is formed a P type layer 410 so that a base region is formed by the surrounded portion of the N type epitaxial layer 49 and an emitter region is formed by the P type layer 410. Designated at 46 is a burried layer. In this way, a vertical type PNP transistor 31 is constituted. At the same time, an NPN transistor 32 is constituted in the second epitaxial layer 44 on the same semiconductor substrate, the NPN transistor 32 being isolated from the PNP transistor 31 by means of a P type isolation region. The vertical type PNP transistor 31 has its collector connected with the collector of the NPN transistor 32, and an output terminal 36 is led out of the connection point therebetween. The vertical type PNP transistor 34 is provided at its emitter with a power source voltage Vcc/2, and the NPN transistor 32 has its emitter grounded.

Figure 8:
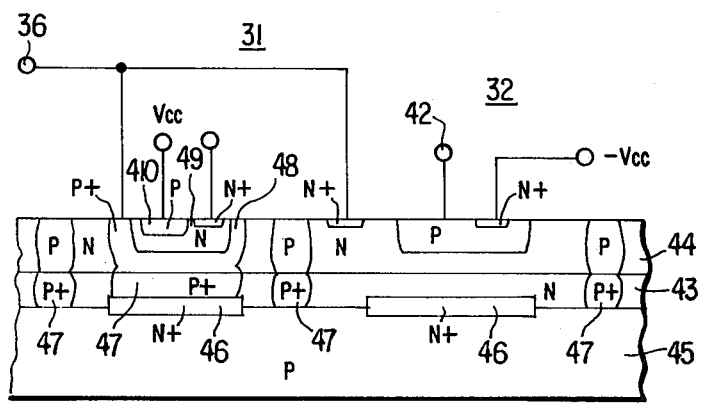
FIG. 8 is a cross sectional view showing another semiconductor integrated circuit device including a vertical type PNP transistor and an NPN transistor according to the present invention.

In a double power source system, the NPN transistor 32 is provided at its emitter with a negative power source voltage $-V_{CC}$ as shown in FIG. 8.

The vertical type PNP transistor 31 formed by the use of two epitaxial layers as mentioned above represents a sufficiently high d. c. current amplification factor $h_{FE}$; with such construction, therefore, it is possible to achieve a desired d. c. current amplification factor without establishing Darlington circuits such as shown in FIG. 2. This facilitates the manufacture of a low frequency power amplifier circuit in an integrated circuit form.

The low frequency power amplifier circuit according to the present invention is capable of operating with a lower power source voltage vy virtue of being constructed in the form of a semiconductor device whose output stage comprises a complementary circuit such as shown in FIG. 4, and in addition, it represents an increased power utilization efficiency.

The power utilization efficiency of the low frequency amplifier circuit according to the present invention as shown in FIG. 3 will now be numerically compared with that of the prior-art low frequency amplifier circuit shown in FIG. 1, assuming that the power source is 3 V. Such an efficiency is given by $$\eta \text{ (efficiency)} = \frac{\text{Output signal voltage } (P_o)}{\text{Consumed power } (P_{DC})} \quad (1)$$

In FIG. 1, the sum of the $V_{BE}$ voltages of the NPN transistor 11 and PNP transistor 12 constitutes power loss of about 1.5 V. The following equations hold true:

$$P_o = \frac{(V_{cc} - 2V_{BE})^2}{8Z} \quad (2)$$

$$P_{DC} = \frac{V_{cc}^2}{8Z} \quad (3)$$

where Z is a load impedance. By using equations (1), (2) and (3), the efficiency is obtained as follows:

$$\eta = \frac{(V_{cc} - 2V_{BE})^2}{V_{cc}^2} = \frac{(3 - 1.5)^2}{3^2} = 0.25 = 25\%$$

In contrast, with the low frequency amplifier circuit according to the present invention wherein the PNP transistor 31 and NPN transistor 32 constitute the output stage thereof, the d. c. voltage $V_{CE}(\text{sat})$ between the collector and the emitter of each transistor contributes to power loss. The d. c. voltage is in a range of 0.1 to 0.2 V, and thus the maximum amplitude of the output signal becomes about 2.6 V, which results in an increased power source voltage efficiency. By using equations (1), (2) and (3), the efficiency is calculated as follows:

$$\eta = \frac{(V_{cc}^2 - 2V_{CE}(sat))^2}{V_{cc}}$$

$$= \frac{2.6^2}{3^2} = 0.751 = 75.1\%$$

As will be readily appreciated from the foregoing explanation, in the case where the power source voltage is as low as about 3 V, the voltage utilization rate (efficiency) is increased from 25% to 75%. Thus, the semiconductor integrated circuit device which constitutes the low frequency power amplifier circuit according to the present invention can provide an output with a greatly increased efficiency.

Description will now be made of distortion which tends to be caused in the output because of the difference in current amplification factor $h_{FE}$ between the vertical type PNP transistor and the NPN transistor which are provided at the output stage to constitute a complementary type circuit in a semiconductor substrate.

Figure 6:
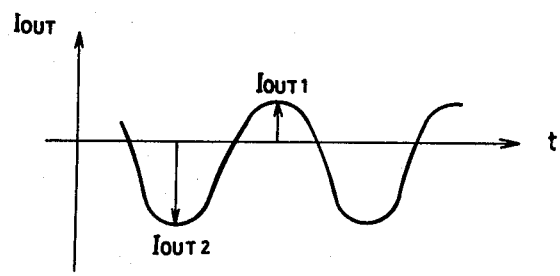
FIG. 6 is a view illustrating an output current waveform.

In the low frequency amplifier circuit shown in FIG. 3, bias currents $I_1$ and $I_2$ are controlled by a current mirror circuit so that these bias currents are homologously related to each other. In the case where the PNP transistor 31 and NPN transistor 32 at the output stage are formed in the same semiconductor substrate, and assuming that the current amplification factors of these two transistors are $h_{FE1}$ and $h_{FE2}$ respectively, the following relationship generally holds: $h_{FE1} < h_{FE2}$. The output current $I_{OUT1}$ is given by $I_{OUT1} = I_1 \cdot h_{FE1}$, and the output current $I_{OUT2}$ is given by $I_{OUT2} = I_2 \cdot h_{FE2}$. Thus, the relationship between the output currents turns out to be $I_{OUT1} < I_{OUT2}$ as shown in FIG. 6. In this way, the output voltages which are produced across the load impedance $Z_1$ of the speaker S will have the following relationship: $I_{OUT1} \cdot Z_1 < I_{OUT2} \cdot Z_1$. FIG. 6 shows the relationship between the output currents $I_{OUT}$ which occur in the low frequency amplifier circuit shown in FIG. 3. As shown in FIG. 6, in the case where vertical type PNP transistor and NPN transistor are provided at the output stage, sinusoidal waveform of the output signal is liable to be derived out as distortion in the output signal, and thus in the case of an audio signal, the audio output is subject to distortion, which provides an uncomfortable feeling.

Figure 5:
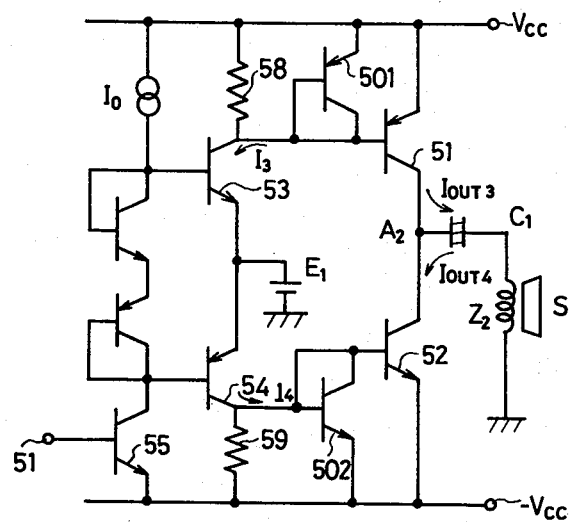
FIG. 5 is a circuit diagram showing the low frequency amplifier circuit according to another embodiment of the present invention.

Referring to FIG. 5, there is shown a still further embodiment of this invention, wherein the output stage comprises a PNP transistor 51 and an NPN transistor 52. The PNP transistor 51 has its emitter connected with a first power source Vcc, the collector of the PNP transistor 51 being connected with the collector of the NPN transistor 52 which has its emitter connected with a second power source—Vcc. Thus, there is formed a so-called complementary symmetrical circuit. At the output stage, the PNP transistor 51, together with a PNP transistor 501, constitutes a current mirror circuit, and also the NPN transistor 52, together with an NPN transistor 502, constitutes another current mirror circuit. Furthermore, the PNP transistor 51, together with an NPN transistor 53, forms an inverted Darlington circuit, and also the NPN transistor 52, together with a PNP transistor 54, forms another inverted Darlington circuit.

There is the tendency that there occurs a difference between output currents $I_{OUT3}$ and $I_{OUT4}$ because of the difference in current amplification factor between the PNP transistor 51 and the NPN transistor 52 which are provided at the output stage. However, by changing the emitter area of the transistors constituting the current mirror circuit, it is possible to control the collector current which flows through the collector of each transistor; thus, distortion which would otherwise be caused can be eliminated equivalently. In the case where the two transistors constituting the current mirror circuit have an equal emitter area, and an equal current can be caused to flow through the transistors, whereas in the case where these transistors are different from each other in terms of emitter area, currents which are in reverse proportion to the emitter areas respectively are caused to flow through the respective transistors. Thus, by making the emitter area ratio $K_1$ of the PNP transistor 51 to the PNP transistor 501 equal to the emitter area ratio $K_2$ of the NPN transistor 52 to the NPN transistor 502, it is possible to establish a homologous relation between the output currents $I_{OUT3}$ and $I_{OUT4}$. The aforementioned emitter area ratios $K_1$ and $K_2$ are given as follows:

$K_1 = (A_{501}/A_{51})$ $K_2 = (A_{502}/A_{52})$ where $A_{51}$ and $A_{501}$ denote the emitter areas of the PNP transistors 51 and 501 respectively, and $A_{52}$ and $A_{502}$ indicate the emitter areas of the NPN transistors 52 and 502 respectively.

By establishing between the emitter area ratios $K_1$ and $K_2$ a relationship such that $K_1 = K_2$, it is possible to make the output currents $I_{OUT3}$ and $I_{OUT4}$ equivalently equal to each other. In this way, it is possible to prevent distortion from being caused in the output voltage available across the load impedance of the speaker. Thus, application of the present invention to the audio field will result in the output signal being improved in terms of distortion, so that uncomfortable feeling which tends to be caused by distortion in the audio output, can be effectively avoided. As will be readily appreciated, the amplifier circuit according to the present invention is equally applicable to other fields than audio field, and in such cases, too, excellent effects can be produced. In addition, in accordance with the present invention, there is provided a power amplifier circuit with a reduced power loss.

Although the present invention has been described with respect to some specific embodiments, it is to be understood that the invention is not restricted thereto but covers any and all modifications and changes which may be made within the scope of the appended claims.

What is claimed is:

1. A semiconductor integrated circuit device comprising a power amplifier circuit including a vertical type PNP transistor and a first NPN transistor which are formed in a common semiconductor substrate, the output stage of said power amplifier circuit comprising a complementary symmetrical circuit wherein an output terminal is led out of the connection point between the collector of said vertical type PNP transistor and the collector of said first NPN transistor, a d.c. power source is connected between said emitter of said vertical type PNP transistor and the emitter of said first NPN transistor, and wherein at least one of the transistors constituting said complementary symmetrical circuit forms a current mirror circuit together with an additional transistor.

2. A semiconductor integrated circuit device comprising a power amplifier circuit including a vertical type PNP transistor and a first NPN transistor which are formed in a common semiconductor substrate, the output stage of said power amplifier circuit comprising a complementary symmetrical circuit wherein an output terminal is led out of the connection point between the collector of said vertical type PNP transistor and the collector of said first NPN transistor, and a negative d.c. power source is supplied to the emitter of said first NPN transistor, and wherein at least one of the transistors constituting said complementary symmetrical circuit forms a current mirror circuit together with an additional transistor.

3. A semiconductor integrated circuit device according to any one of claims 4 and 5, wherein said vertical type PNP transistor and a second PNP transistor form a first current mirror circuit and said first NPN transistor and a second NPN transistor form a second current mirror circuit; and wherein the emitter area ratio of the transistors constituting the first current mirror circuit is made equal to the emitter area ratio of the transistors constituting the second current mirror circuit.

4. A semiconductor integrated circuit device according to claims 1 or 2 wherein each of the transistors constituting said complementary symmetrical circuit forms a current mirror circuit together with an additional transistor.

5. A semiconductor integrated circuit device comprising a power amplifier circuit including a vertical type PNP transistor and a first NPN transistor which are formed in a common semiconductor substrate, the output stage of said power amplifier circuit comprising a complementary symmetrical circuit wherein an output terminal is led out of the connection point between the collector of said vertical type PNP transistor and the collector of said first NPN transistor, the emitter of said vertical type PNP transistor being connected to a first reference potential, and the emitter of said first NPN transistor being connected to a second reference potential, and wherein at least one of the transistors constituting said complementary symmetrical circuit forms a current mirror circuit.

6. A semiconductor integrated circuit device according to claim 5 where said first reference potential is provided by a first DC voltage source and said second reference potential is provided by a second DC voltage source.

7. A semiconductor integrated circuit device according to claims 5, or 6, wherein said vertical type PNP transistor and a second PNP transistor form a first current mirror circuit and said first NPN transistor and a second NPN transistor form a second current mirror circuit; and wherein the emitter area ratio of the transistors constituting the first current mirror circuit is made equal to the emitter area ratio of the transistors constituting the second current mirror circuit.

8. A semiconductor integrated circuit device according to claims 5, or 6 wherein each of the transistors constituting said complementary symmetrical circuit forms a current mirror circuit together with an additional transistor.

9. A low frequency amplifier circuit comprising vertical type PNP transistors and NPN transistors formed in a common semiconductor substrate, wherein the emitter of a first one of said vertical PNP transistors is connected to a first terminal; the collector of said first vertical type PNP transistor and that of a first one of said NPN transistors are connected to provide an output terminal; a first resistor is connected at one end to said first terminal, the other end said first resistor being connected to the collector of a second one of said NPN transistors; the emitter of said second NPN transistor and that of a second one of said vertical type PNP transistors are connected to a third terminal; a second resistor is connected at one end to the collector of said second vertical type PNP transistor, the other end of said second resistor being connected to said second terminal; the base of said first vertical type PNP transistor is connected to the connection point between said first resistor and the collector of said second NPN transistor; the base of said first NPN transistor is connected to the connection point between said second resistor and the collector of said second vertical type PNP transistor; a first DC voltage source is connected between said first terminal and said second terminal; and a second DC voltage source is connected between said second terminal and said third terminal.

10. A low frequency amplifier circuit according to claim 9, wherein the emitter of said first vertical type PNP transistor and that of a third one of said vertical type PNP transistors are connected to each other; the base and collector of said third vertical type PNP transistor are connected to the base of said first vertical type PNP transistor to form a first current mirror circuit; the emitter of said first NPN transistor and that of said third NPN transistor are connected to each other; and the collector and base of said third NPN transistor are connected to the base of said first NPN transistor to form a second current mirror circuit.

11. A low frequency amplifier circuit according to claim 10, wherein the emitter area ratio of said first and third vertical PNP transistors forming said first current mirror circuit is made equal to the emitter area ratio of said first and third NPN transistors forming said second current mirror circuit.

12. A low frequency amplifier circuit comprising vertical type PNP transistors and NPN transistors formed in a common semiconductor substrate, wherein the emitter of a first one of said vertical PNP transistors is connected to a first terminal; the collector of said first vertical type PNP transistor and that of a first one of said NPN transistors are connected to provide an output terminal; a first resistor is connected at one end to said first terminal, the other end said first resistor being connected to the collector of a second one of said NPN transistors; the emitter of said second NPN transistor and that of a second one of said vertical type PNP transistors are connected to a third terminal; a second resistor is connected at one end to the collector of said second vertical type PNP transistor, the other end of said second resistor being connected to said second terminal; the base of said first vertical type PNP transistor is connected to the connection point between said first resistor and the collector of said second NPN transistor; the base of said first NPN transistor is connected to the connection point between said second resistor and the collector of said second vertical type PNP transistor; said first terminal being connected to a first reference potential; said second terminal being connected to a second reference potential; and said third terminal being connected to a third reference potential.

13. A semiconductor integrated circuit device according to claim 12 where said first reference potential is provided by a first DC voltage source; said second reference potential is ground; and said third reference potential is provided by a second DC voltage source.

14. A semiconductor integrated circuit device according to claim 12 where said first reference potential is provided by a first DC voltage source; said second reference potential is provided by a second DC voltage source; and said third reference potential is ground.

15. A low frequency amplifier circuit according to claims 12, 13 or 14, wherein the emitter of said first vertical type PNP transistor and that of a third one of said vertical type PNP transistors are connected to each other; the base and collector of said third vertical type PNP transistor are connected to the base of said first vertical type PNP transistor to form a first current mirror circuit; the emitter of said first NPN transistor and that of said third NPN transistor are connected to each other; and the collector and base of said third NPN transistor are connected to the base of said first NPN transistor to form a second current mirror circuit.

16. A low frequency amplifier circuit according to claim 15 wherein the emitter area ratio of said first and third vertical PNP transistors forming said first current mirror circuit is made equal to the emitter area ratio of said first and third NPN transistors forming said second current mirror circuit.

* * * * *